(12) United States Patent
Zhou et al.

(10) Patent No.: US 9,935,099 B2
(45) Date of Patent: Apr. 3, 2018

(54) SEMICONDUCTOR DEVICE

(71) Applicant: UNITED MICROELECTRONICS CORP., Hsin-Chu (TW)

(72) Inventors: Zhibiao Zhou, Singapore (SG); Chen-Bin Lin, Taipei (TW); Su Xing, Singapore (SG); Chi-Chang Shuai, Hsinchu (TW); Chung-Yuan Lee, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/956,398

(22) Filed: Dec. 2, 2015

(65) Prior Publication Data
US 2017/0125402 A1    May 4, 2017

(30) Foreign Application Priority Data

Oct. 30, 2015    (TW) .............................. 104135712 A

(51) Int. Cl.
| | |
|---|---|
| *H01L 27/06* | (2006.01) |
| *H01L 23/535* | (2006.01) |
| *H01L 29/22* | (2006.01) |
| *H01L 29/861* | (2006.01) |
| *H01L 29/10* | (2006.01) |
| *H01L 29/24* | (2006.01) |
| *H01L 49/02* | (2006.01) |
| *H01L 29/06* | (2006.01) |

(52) U.S. Cl.
CPC ........ *H01L 27/0629* (2013.01); *H01L 23/535* (2013.01); *H01L 28/40* (2013.01); *H01L 29/0603* (2013.01); *H01L 29/1079* (2013.01); *H01L 29/22* (2013.01); *H01L 29/24* (2013.01); *H01L 29/861* (2013.01)

(58) Field of Classification Search
None
See application file for complete search history.

(56) References Cited

U.S. PATENT DOCUMENTS

| 6,365,939 B1 * | 4/2002 | Noguchi ................. H01L 23/60 |
| | | 257/355 |
| 8,946,702 B2 | 2/2015 | Yamazaki et al. |
| 9,024,317 B2 | 5/2015 | Endo et al. |
| 9,070,546 B2 | 6/2015 | Umezaki |
| 2011/0115016 A1 * | 5/2011 | Cha .................... H01L 21/76264 |
| | | 257/337 |

(Continued)

OTHER PUBLICATIONS

US 9,076,679, 07/2015, Yamazaki et al. (withdrawn)

*Primary Examiner* — Whitney T Moore
(74) *Attorney, Agent, or Firm* — Winston Hsu

(57) ABSTRACT

The present invention provides a semiconductor device including a semiconductor substrate, a first well, a second well, a gate electrode, an oxide semiconductor structure and a diode. The first well is disposed in the semiconductor substrate and has a first conductive type, and the second well is also disposed in the semiconductor substrate, adjacent to the first well, and has a second conductive type. The gate electrode is disposed on the first well. The oxide semiconductor structure is disposed on the semiconductor substrate and electrically connected to the second well. The diode is disposed between the first well and the second well.

21 Claims, 5 Drawing Sheets

(56) References Cited

U.S. PATENT DOCUMENTS

| | | | |
|---|---|---|---|
| 2012/0161230 A1* | 6/2012 | Satoh | H01L 29/66681 257/335 |
| 2014/0264586 A1* | 9/2014 | Moon | H01L 29/66681 257/343 |
| 2015/0069386 A1 | 3/2015 | Osada | |

* cited by examiner

SEMICONDUCTOR DEVICE

BACKGROUND OF THE INVENTION

1. Field of the Invention

The present invention relates to a semiconductor device, and more particularly to a semiconductor device having an oxide semiconductor structure.

2. Description of the Prior Art

In the modern society, the micro-processor systems comprising integrated circuits (IC) are ubiquitous devices, being utilized in diverse fields such as automatic control electronics, mobile communication devices and personal computers. With the development of technology and the increase of original applications for electronic products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxides. Indium tin oxide (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor materials, and it is desired for researchers to develop a semiconductor device by using their semiconductor material properties, such as an oxide semiconductor transistor.

However, due to oxidation of the semiconductor material itself, when using this oxide semiconductor material, it is easy to damage the oxide semiconductor layer during the production process, thus affecting the performance of the product. Therefore, for a semiconductor device having an oxide semiconductor material, there is still a need for a better design or a manufacturing method, thereto gain better quality.

SUMMARY OF THE INVENTION

It is one of the primary objectives of the present invention to provide a semiconductor device having an oxide semiconductor structure, in order to gain a better product performance.

To achieve the purpose described above, one embodiment of the present invention provides a semiconductor device including a semiconductor substrate, a first well, a second well, a gate electrode, an oxide semiconductor structure and a diode. The first well is disposed in the semiconductor substrate and has a first conductive type. The second well is disposed in the semiconductor substrate and adjacent to the first well, the second well having a second conductive type. The gate electrode is disposed on the first well. The oxide semiconductor structure is disposed on the semiconductor substrate and is electrically connected to the second well. The diode is disposed between the first well and the second well.

According to the above, the semiconductor device in the present invention utilizes the first well, the second well and the doped region disposed in the semiconductor device to form a diode, such as a NPN diode, a PNP diode or a PN diode. Following this manner, the semiconductor device of the present invention may be further used on a memory cell of a random access memory, so that, the diode may be disposed between two MOSFETs in the memory cell, so as to effectively improve the current leakage issue.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
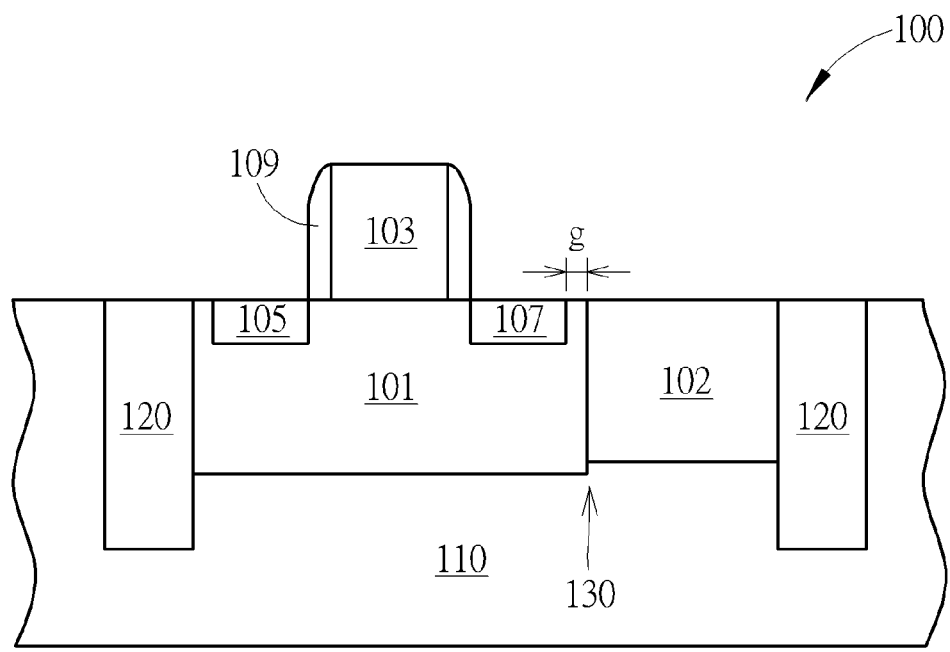
FIG. 1 to FIG. 2 are schematic diagrams illustrating a method of forming a semiconductor device according to a first embodiment of the present invention.

To provide a better understanding of the presented invention, preferred embodiments will be described in detail. The preferred embodiments of the present invention are illustrated in the accompanying drawings with numbered elements.

Please refer to FIG. 1 to FIG. 4, which are schematic diagrams illustrating a method of forming a semiconductor device according to the first embodiment of the present invention. First of all, a semiconductor structure 100 is provided, wherein the semiconductor structure 100 includes a semiconductor substrate 110, a first well 101, a gate electrode 103, two doped regions 105, 107, at least one shallow trench isolation (STI) 120 and a second well 102. Precisely speaking, the semiconductor substrate 110 for example is a silicon substrate, an epitaxial silicon substrate or a silicon-on-insulator (SOI) substrate, but is not limited thereto, and the shallow trench isolation 120 is formed therein.

Figure 3:
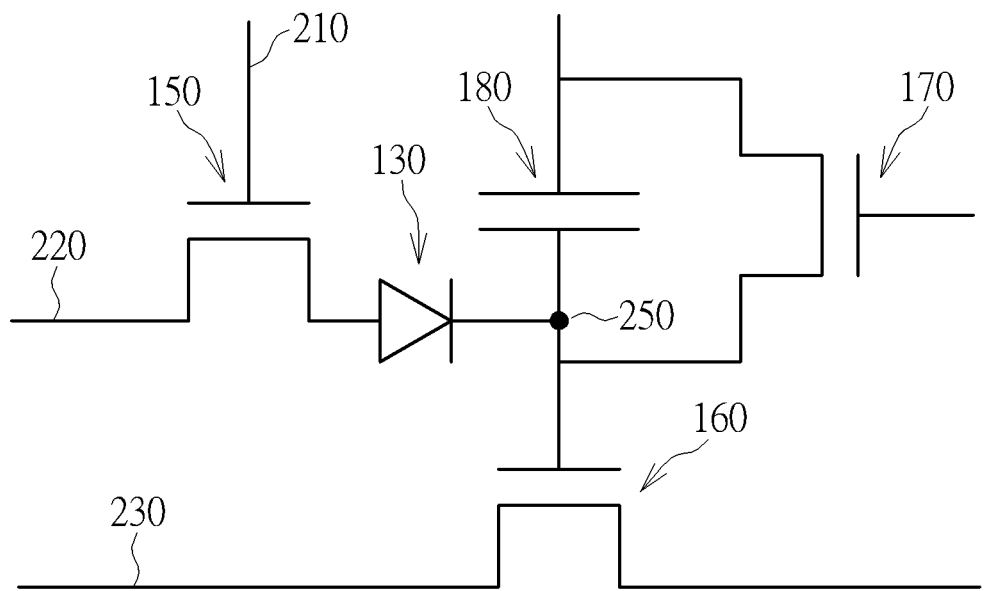
FIG. 3 to FIG. 4 are schematic diagrams illustrating equivalent circuits of a semiconductor device according to the first embodiment of the present invention.

The first well 101 is disposed in the semiconductor substrate 110 and is surrounded by the shallow trench isolation 120, wherein the first well 101 has a first conductive type, and the semiconductor substrate 110 preferably has a second conductive type. Precisely speaking, the first well 101 may be formed by performing a first ion implantation process with a dopant having the first conductive type, but is not limited thereto. The gate electrode 103 is disposed on the first well 101 and completely within the range of the first well 101. Also, there is a spacer 109 surrounding the gate electrode 103, as shown in FIG. 3, and the spacer 109 may include high temperature oxide (HTO), silicon nitride, silicon oxide or silicon nitride formed by hexachlorodisilane ($Si_2Cl_6$) (HCD-SiN). The doped regions 105, 107 are disposed in the first well 101, at two sides of the gate electrode 103. The doped regions 105, 107 preferably have the same conductive type as that of the semiconductor substrate 110, namely, the second conductive type, and may be formed through a second ion implantation process with a dopant having the second conductive type. It is noted that, the doping concentration of the doped regions 105, 107 is substantially greater than that of the semiconductor substrate 110.

The second well 102 is also disposed in the semiconductor substrate 110 and adjacent to the first well 101. The second well 102, the doped regions 105, 107, and the semiconductor substrate 110 may have the same conductive type, and the doping concentration of the second well 102 is substantially less than that of the doped regions 105, 107 but is greater than that of the semiconductor substrate 110. It is worth noting that, the doped regions 105, 107 do not directly contact the second well 102, and the doped region 107 is disposed between the gate electrode 103 and the second well 102 and is spaced from the second well 102 by a gap "g", as shown in FIG. 1. On the other hand, the doped region 105 is disposed between the gate electrode 103 and the shallow trench isolation 102. Through such arrangement, the doped region 107, the first well 101 and the second well 102 may together form a diode 130. In one embodiment, when the first conductive type is P-type, and the second conductive type is N-type for example, the first well 101, the second well 102 and the doped regions 105, 107 are namely a P-type first well, an N-type second well and an N-type doped region respectively, and the diode 130 formed accordingly may be a NPN diode, but is not limited thereto. In another embodiment, when the first conductive type is N-type, and the second conductive type is P-type for example, the semiconductor substrate 110 is a P-type semiconductor substrate. Thus, the first well 101, the second well 102 and the doped regions 105, 107 are namely an N-type first well, a P-type second well and a P-type doped region respectively, and the diode 130 formed accordingly may be a PNP diode.

Figure 2:
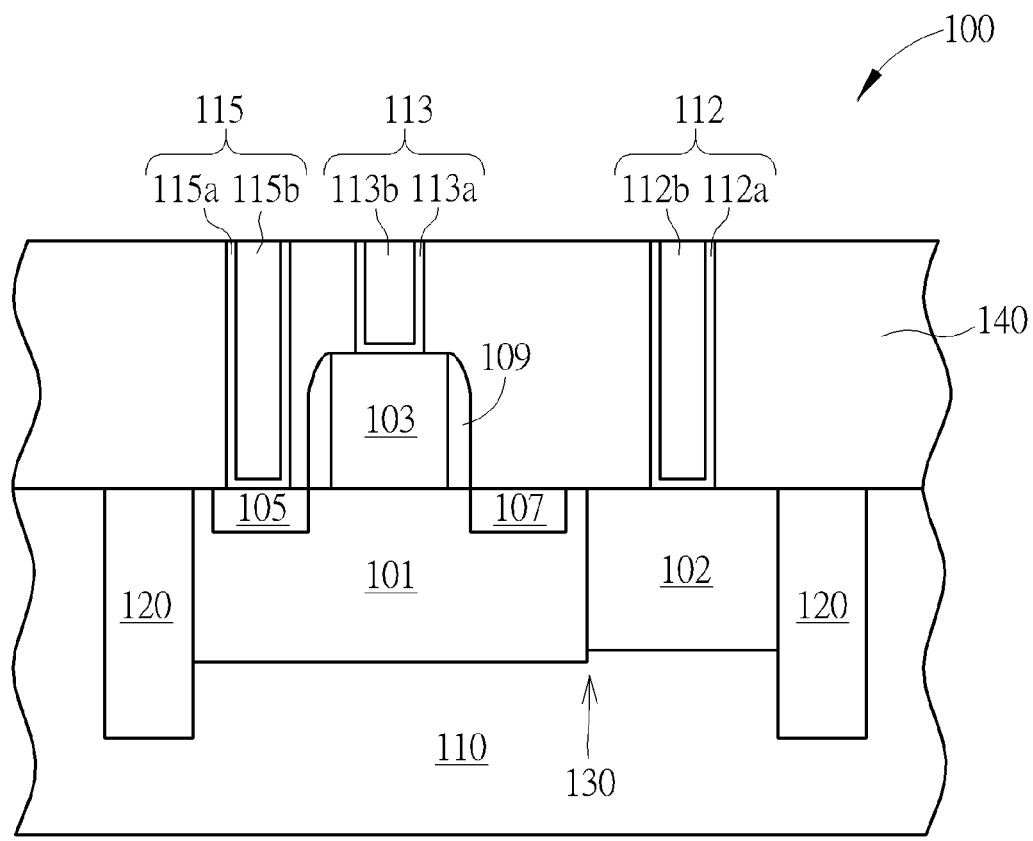

Next, after forming a silicide block (SAB) layer (not shown in the drawings) optionally, a silicidation process may be performed, to form a silicide (not shown in the drawings) on surfaces of the doped regions 105, 107, followed by completely removing the silicide block layer. Then, an interlayer dielectric (ILD) layer 140 is formed to completely cover the semiconductor substrate 110 and the gate electrode 103, and contact plugs 115, 113, 112 which are electrically connected to the doped region 105, the gate electrode 103 and the second well 102 are formed respectively in the interlayer dielectric layer 140, as shown in FIG. 2. The formation of the contact plugs 115, 113, 112 for example includes firstly forming a plurality of openings (not shown in the drawings) connected to the doped region 105, the gate electrode 103 and the second well 102 respectively, sequentially forming a barrier material layer (not shown in the drawings) and a metal material layer (not shown in the drawings) in the openings, and removing a portion of the metal material layer and a portion of the barrier material layer through a planarization process (e.g. a chemical mechanical polish process, an etching back process or a combination thereof), to form the contact plugs 115, 113, 112, respectively. In this way, the contact plugs 115, 113, 112 may be level with the top surface of the interlayer dielectric layer 140, and each contact plug 115, 113, 112 may include a barrier layer 115a, 113a, 112a and a contact metal layer 115b, 113b, 112b, respectively. In one embodiment of the present invention, the barrier layers 115a, 113a, 112a may include titanium, titanium nitride, tantalum or tantalum nitride; and the contact metal layers 115b, 113b, 112b may include tungsten or other metal materials having lower resistance, but not limited thereto.

Figure 4:
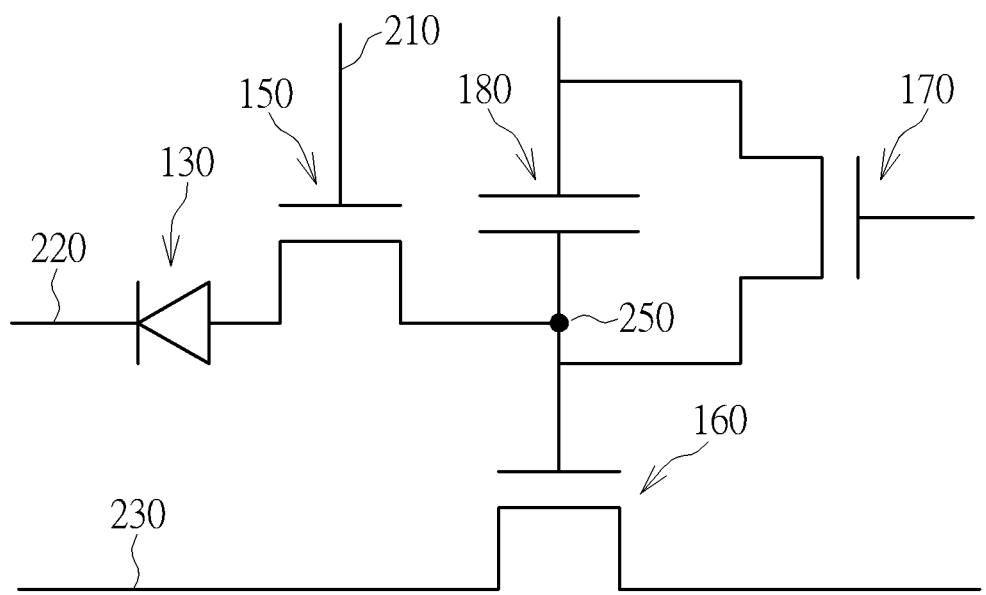

Through the above-mentioned steps, the semiconductor device of the first preferred embodiment of the present invention is obtained, and may be used on the equivalent circuits shown in FIG. 3 or FIG. 4. Precisely speaking, the gate electrode 103 of the semiconductor device may function as a first metal-oxide-semiconductor field-effect transistor (MOSFET) 150 in the equivalent circuits shown in FIG. 3 or FIG. 4, wherein the first MOSFET 105 may be an NMOS transistor and may be formed while a second MOSFET (also an NMOS transistor) 160 is formed. The first MOSFET 150 may accompany with the second MOSFET 160, and an oxide-semiconductor structure, such as an oxide-semiconductor field-effect transistor (OSFET) 170 or other dual gate structure, and a capacitor 180 formed in the subsequent process, to compose a memory cell of a random access memory (RAM), but is not limited thereto. In one embodiment, the first MOSFET 150 may be used as a writing control element, the second MOSFET 160 may be used as a reading control element, and the OSFET 170 and the capacitor 180 may be used as an erasing control element and storing element respectively, but is not limited thereto. In the present embodiment, the OSFET 170 and the capacitor 180 may be electrically connected to the contact plug 112 shown in FIG. 2, and to further connected to the second well 102 through the contact plug 112 thereby, but are not limited thereto.

Please refer to the equivalent circuit shown in FIG. 3, and it is noted that, a storage node 250 is electrically connected to the diode 130, the capacitor 180, the source of the OSFET 170 and the gate of the second MOSFET 160 respectively; and the gate of the first MOSFET 150 is electrically connected to corresponding word line (WL) 210, for controlling writing function. Also the sources of the first MOSFET 150 and the second MOSFET are electrically connected to corresponding bit lines (BL) 220, 230, respectively, for controlling reading and erasing functions; and the drain of the first MOSFET 150 is coupled to the diode 130. In the present embodiment, although the diode 130 is exemplified to be disposed at the right of the first MOSFET 150, the present invention is not limited thereto. In another embodiment, the diode 130 may also be disposed at the left of the first MOSFET 150, as shown in FIG. 4. In other words, the setting position of the diode 130 depends on the direction of the currents. For example, when the positive voltage is applied to the capacitor 180, the diode 130 is preferably disposed at the right of the first MOSFET 150, as shown in FIG. 3. On the other hand, when the negative voltage is applied to the capacitor 180, the diode 130 is preferably disposed at the left of the first MOSFET 150, as shown in FIG. 4.

In summary, a diode is additionally disposed between two MOSFETs in the memory cell of the present invention, such that, the current leakage issue may be effectively improved. Furthermore, an OSFET is used as the erasing control element in the present invention. In comparison with the MOSFET, the OSFET is relative lower in velocity, so that, the reverse current may be sufficiently reduced, and then, the reading speed of the memory cell may be significantly improved thereby.

However, people skilled in the art shall easily realize that the semiconductor device in the present invention is not limited to be formed through the aforementioned steps, and may include other forming processes. Thus, the following description will detail the different embodiments of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
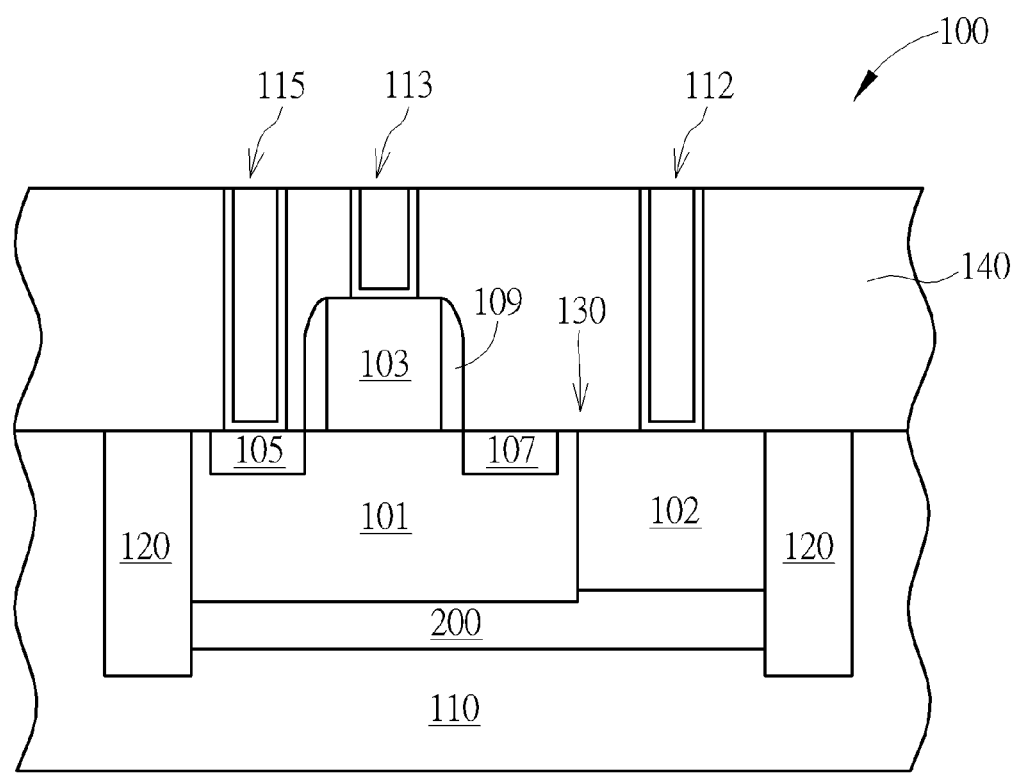
FIG. 5 is a schematic diagram illustrating a semiconductor device according to a second embodiment of the present invention.

Please refer to FIG. 5, which is a schematic diagram illustrating a semiconductor device according to the second embodiment of the present invention. The formal features and steps in the present embodiment are similar to those in the aforementioned first embodiment, including sequentially forming the semiconductor substrate 110, and the first well 101, the second well 102 and the doped regions 105, 107 in the semiconductor substrate 110, so that, the doped region 107, the first well 101 and the second well 102 may also together form the diode 130. The differences between the present embodiment and the aforementioned first embodiment are that a third well 200 may be further formed in the semiconductor structure 100, and which is disposed in the semiconductor substrate 110. Also, the first well 101, the second well 102 and the doped regions 105, 107 are all disposed in the third well 200, as shown in FIG. 5. Precisely speaking, the semiconductor substrate 110 of the present embodiment may have any conductive type or no conductive type, and the third well 200 may preferably have the same conductive type as that of the second well 102, namely the second conductive type. However, the doping concentration of the second well 102 is substantially greater than that of the third well 200. In one embodiment, the third well 200 may be formed through a third ion implantation process with a dopant having the second conductive type.

Figure 6:
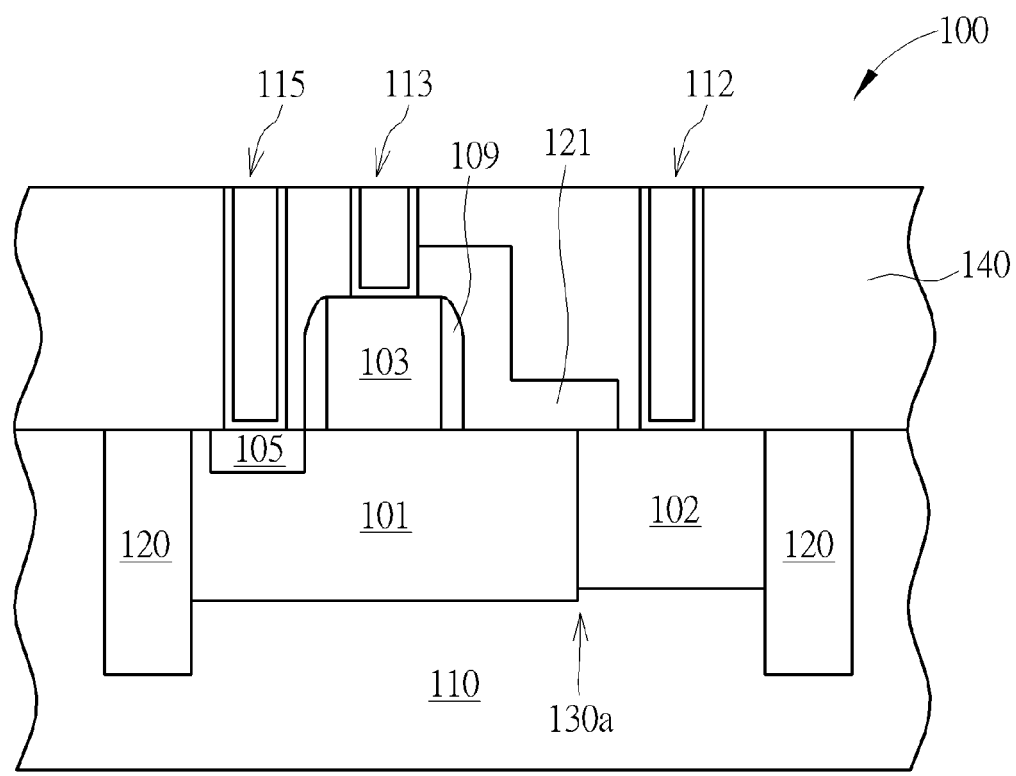
FIG. 6 to FIG. 8 are schematic diagrams illustrating a semiconductor device according to a third embodiment of the present invention.
Figure 7:
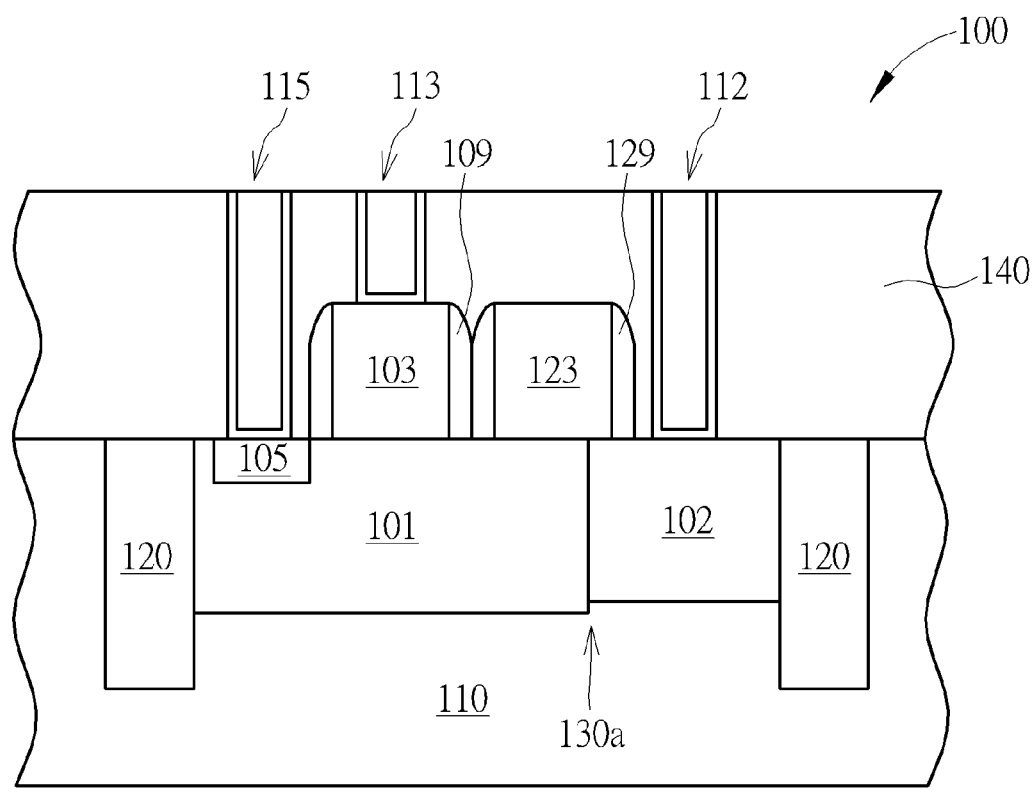
Figure 8:
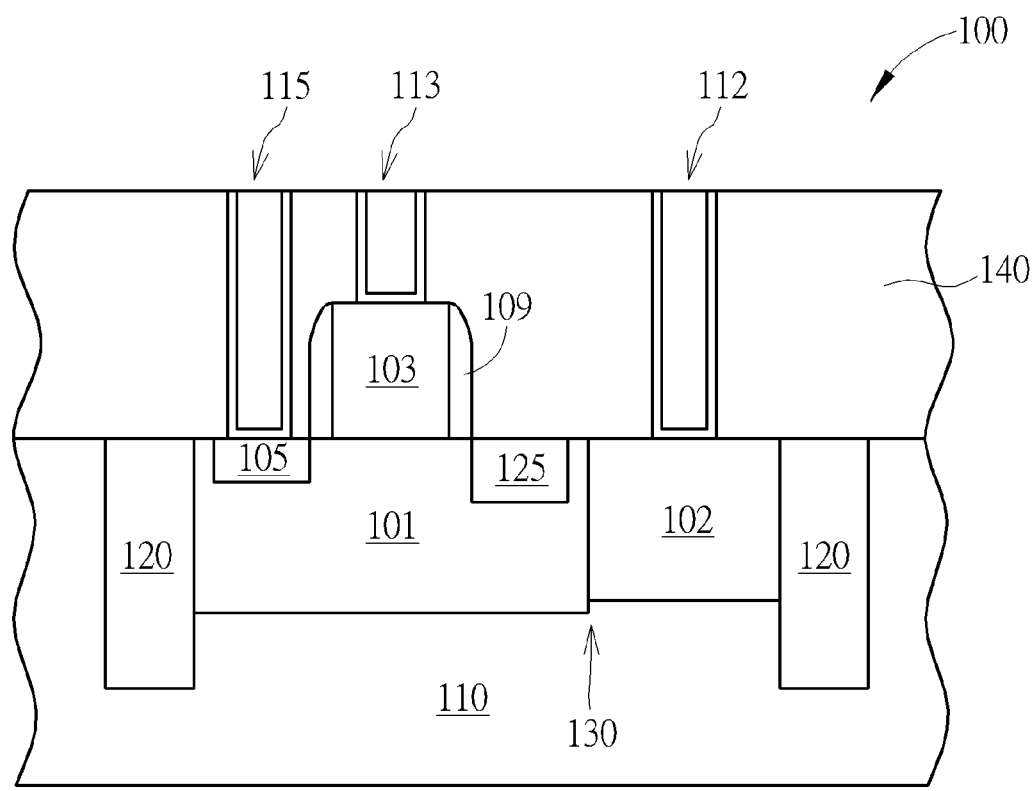

Please refer to FIGS. 6-8, which are schematic diagrams illustrating a semiconductor device according to the third embodiment of the present invention. The formal features and steps in the present embodiment are similar to those in the aforementioned first embodiment, including sequentially forming the semiconductor substrate 110, and the first well 101 and the second well 102 in the semiconductor substrate 110. The differences between the present embodiment and the aforementioned first embodiment are that only the doped region 105 between the gate electrode 103 and the shallow trench isolation 120 is formed.

In other words, before the second ion implantation process is performed, a silicide block layer 121, for example including silicon oxide, silicon nitride or silicon oxynitride, is optionally formed on the first well 101 in the present embodiment, to partially cover the first well 101, thereby functioning like a blocking structure. In this manner, while the second ion implantation process is performed in the subsequent processes, only the doped region 105 may be formed at one side of the gate electrode 103, as shown in FIG. 6. Thus, only the first well 101 and the second well 102 in the semiconductor substrate 110 may forma diode 130a. In one embodiment, when the first conductive type is P-type, and the second conductive type is N-type for example, the first well 101 and the second well 102 are namely a P-type first well and an N-type second well respectively, and the diode 130a may be a PN diode thereby, but is not limited thereto. In another embodiment, when the first conductive type is N-type and the second conductive type is P-type for example, the semiconductor substrate 110 is namely a P-type semiconductor substrate. Accordingly, the first well 101 and the second well 102 are namely an N-type first well and a P-type second well respectively, and the diode 130a may be a NP diode thereby. It is noted that, the silicide block layer 121 may only cover a portion of the first well 101, or simultaneously cover a portion of the first well 101, a portion of the second well 102 and the spacer 109, as shown in FIG. 6, to ensure only the doped region 105 being formed in the semiconductor substrate 110, at one side of the gate electrode 103 in the present embodiment.

Additionally, in order to block the formation of the doped region, in another embodiment of the present embodiment, a dummy gate electrode 123 may be optionally formed on the first well 101, as shown in FIG. 7, to function like the blocking structure. Precisely speaking, the formation of the dummy gate electrode 123 may be integrated with a forming process of general gate electrode, for example, being formed while the gate electrode 103 is formed. Following these, spacers 109, 129 may be formed to surround the gate electrode 103 and the dummy gate electrode 123 respectively. In one embodiment, the spacers 109, 129 may directly contact with each other, so that, only the doped region 105 may be formed at one side of the gate electrode 103 while the second ion implantation process is performed, as shown in FIG. 7. In this way, the first well 101 and the second well 102 in the semiconductor device 110 may together form the diode 130a under the blocking structure, for example a PN diode or a NP diode.

Also, in another embodiment, a shallow trench isolation 125 may also be formed previously in the first well 101, as shown in FIG. 8, to function like the blocking structure. With such performance, while performing the second ion implantation process, only the doped region 105 may be formed at one side of the gate electrode 103, and the first well 101 and the second well 102 in the semiconductor device 110 may also together form the diode 130a, for example a PN diode or a NP diode.

Figure 9:
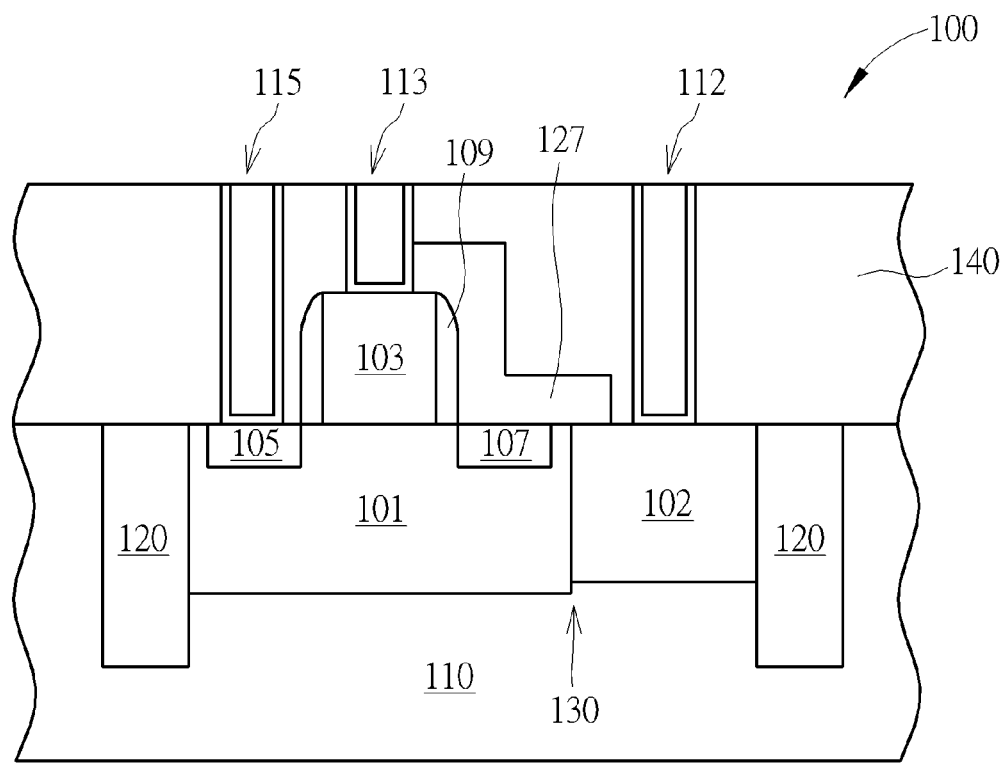
FIG. 9 to FIG. 10 are schematic diagrams illustrating a semiconductor device according to a fourth embodiment of the present invention.
Figure 10:
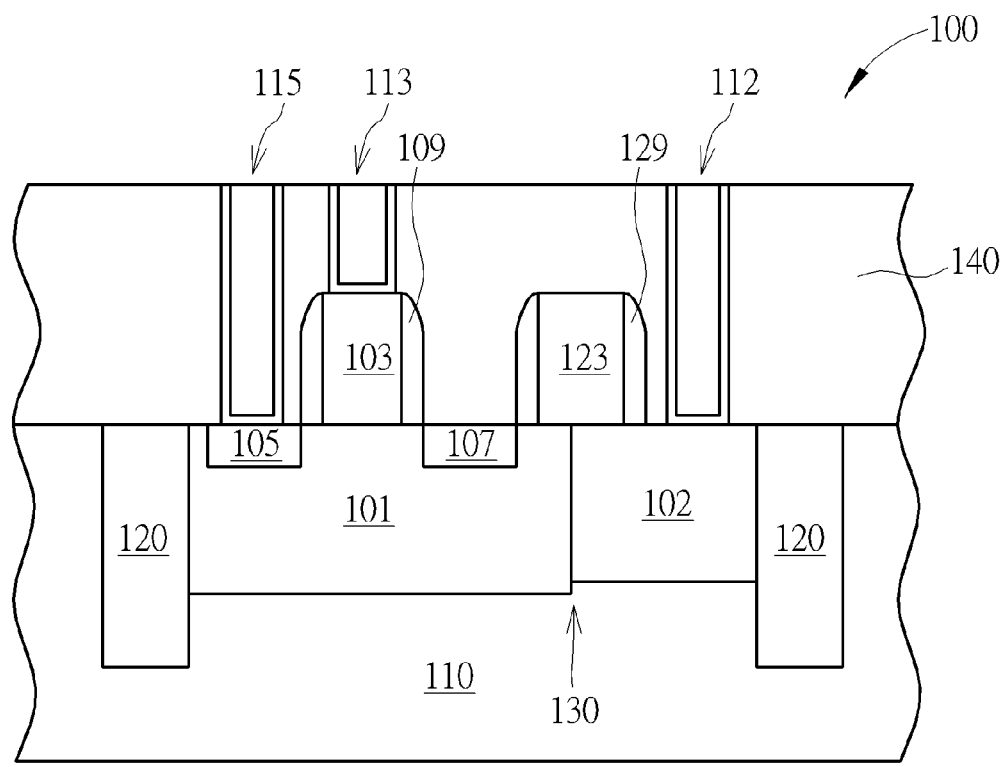

Please refer to FIG. 9 to FIG. 10, which are schematic diagrams illustrating a semiconductor device according to the fourth embodiment of the present invention. The formal features and steps in the present embodiment are similar to those in the aforementioned first embodiment, including sequentially forming the semiconductor substrate 110, and the first well 101, the second well 102 and the doped regions 105, 107 in the semiconductor substrate 110, so that, the doped region 107, the first well 101 and the second well 102 may also form the diode 130. The differences between the present embodiment and the aforementioned first embodiment are that after performing the silicidation process, the silicide block layer (not shown in the drawings) may optionally remain to function like a blocking structure 127, thereby covering on the gate electrode 103, the doped region 107 and the first well 101.

Precisely speaking, the blocking structure 127, for example includes silicon oxide, silicon nitride or silicon oxynitride, but is not limited thereto. It is worth noting that, the blocking structure 127 preferably covers the entire doped region 107, such that, the silicide layer (not shown in the drawings) may only be formed on the doped region 105. Then, the doped region 107, the first well 101 and the second well 102 in the semiconductor substrate 110 may together form the diode 130 under the blocking structure 127, such as a NPN diode or a PNP diode.

Otherwise, in another embodiment, the dummy gate electrode 123, as well as the spacer 129 surrounding the dummy gate electrode 123, may also be disposed optionally on the first well 101, and the spacer 129 is preferably spaced from the spacer 109 by a gap, as shown in FIG. 10. Then, while the second ion implantation process is performed in the subsequent processes, the doped region 107 may be formed between the spacers 109, 129. In this way, the doped region 107, the first well 101 and the second well 102 in the semiconductor substrate 110 may still form the diode 130, such as a NPN diode or a PNP diode.

Through the present invention, the semiconductor device utilizes the first well, the second well and the doped region disposed in the semiconductor device to form a diode, such as a NPN diode, a PNP diode or a PN diode. Following this manner, the semiconductor device of the present invention may be further used on a memory cell of a random access memory, so that, the diode may be disposed between two MOSFETs in the memory cell, so as to effectively improve the current leakage issue. On the other hand, the semiconductor device may be further connected to an OSFET. Through using such OSFET as an erasing control element in the memory cell, it is sufficient to reduce reverse current, and then, the reading speed of the memory cell may also be effectively improved thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   a first well, disposed in the semiconductor substrate and having a first conductive type;
   a second well disposed in the semiconductor substrate, adjacent to the first well and having a second conductive type;
   a gate electrode disposed on the first well;
   a blocking structure disposed on the first well to directly in contact with a portion of the gate electrode and an interface of the first well and the second well;
   a dielectric layer disposed on the substrate, covering the blocking structure, the gate electrode, the first well and the second well; and
   a plurality of plugs disposed in the dielectric layer and not disposed in the blocking structure.

2. The semiconductor device according to claim 1, further comprising:
   a first doped region disposed in the first well and spaced from the second well, the first doped region having the second conductive type.

3. The semiconductor device according to claim 2, wherein the first doped region is disposed between the gate electrode and the second well.

4. The semiconductor device according to claim 2, further comprising:
   a second doped region disposed in the first well, wherein the first doped region and the second doped region are disposed at two sides of the gate electrode.

5. The semiconductor device according to claim 2, wherein the plugs comprise:
   a plug electrically connected to the first doped region.

6. The semiconductor device according to claim 1, further comprising:
   a third well disposed in the semiconductor substrate and having the first conductive type, wherein the first well and the second well are both disposed in the third well.

7. The semiconductor device according to claim 1, wherein the blocking structure covers a diode disposed between the first well and the second well.

8. The semiconductor device according to claim 1, wherein the blocking structure covers a portion of the second well.

9. The semiconductor device according to claim 1, further comprising:
   a spacer surrounding the gate electrode, wherein the blocking structure covers the spacer.

10. The semiconductor device according to claim 9, wherein the blocking structure comprises silicon oxide, silicon nitride, or silicon oxynitride.

11. The semiconductor device according to claim 1, wherein the blocking structure comprises a dummy gate electrode.

12. The semiconductor device according to claim 11, further comprising:
    a first spacer surrounding the gate electrode; and
    a second spacer surrounding the dummy gate electrode, wherein the first spacer and the second spacer contact with each other.

13. The semiconductor device according to claim 1, wherein the plugs comprise:
    a first plug electrically connected to the gate electrode; and
    a second plug electrically connected to the second well.

14. The semiconductor device according to claim 1, wherein the second well electrically connects a capacitor.

15. The semiconductor device according to claim 1, further comprising:
    a shallow trench isolation disposed in the semiconductor substrate and surrounding the first well and the second well.

16. A semiconductor device, comprising:
    a semiconductor substrate;
    a first well, disposed in the semiconductor substrate and having a first conductive type;
    a second well disposed in the semiconductor substrate, adjacent to the first well and having a second conductive type, wherein the second well electrically connects a capacitor; and
    a gate electrode disposed on the first well.

17. The semiconductor device according to claim 16, further comprising:
    a first doped region disposed in the first well and spaced from the second well, the first doped region having the second conductive type.

18. The semiconductor device according to claim 17, wherein the first doped region is disposed between the gate electrode and the second well.

19. The semiconductor device according to claim 16, further comprising:
    a blocking structure disposed on the first well.

20. The semiconductor device according to claim 19, wherein the blocking structure covers a diode disposed between the first well and the second well.

21. The semiconductor device according to claim 19, wherein the blocking structure includes an asymmetry shape.

* * * * *